US008476685B2

(12) United States Patent
Lee

(10) Patent No.: US 8,476,685 B2

(45) **Date of Patent: *Jul. 2, 2013**

(54) IMAGE SENSOR AND METHOD FOR FABRICATING THE SAME

(75) Inventor: Kwang-Ho Lee, Chungeheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 265 days.

This patent is subject to a terminal disclaimer.

(21) Appl. No.: 13/023,754

(22) Filed: Feb. 9, 2011

(65) Prior Publication Data

US 2011/0127630 A1 Jun. 2, 2011

Related U.S. Application Data

(60) Continuation of application No. 12/632,424, filed on Dec. 7, 2009, now Pat. No. 7,893,469, and a division of application No. 11/508,956, filed on Aug. 24, 2006, now Pat. No. 7,638,347.

(30) Foreign Application Priority Data

Aug. 26, 2005 (KR) ........................ 10-2005-0078838

(51) Int. Cl.
*H01L 27/108* (2006.01)

(52) U.S. Cl.
USPC .................... 257/292; 257/519; 257/E29.016

(58) Field of Classification Search
USPC ................. 257/291–292, 519, 349, 398–400, 257/444, E29.016
See application file for complete search history.

(56) References Cited

U.S. PATENT DOCUMENTS

| | | | | |
|---|---|---|---|---|
| 4,977,096 | A | 12/1990 | Shimada | |
| 7,033,895 | B2 | 4/2006 | Lee | |
| 7,112,511 | B2 | 9/2006 | Hong | |
| 7,608,872 | B2 * | 10/2009 | Kim | 257/291 |
| 7,893,469 | B2 * | 2/2011 | Lee | 257/292 |
| 2002/0019102 | A1 | 2/2002 | Ang | |
| 2004/0051159 | A1 | 3/2004 | Terashima | |
| 2004/0053457 | A1 | 3/2004 | Sohn | |
| 2004/0185595 | A1 | 9/2004 | Lee | |
| 2005/0167709 | A1 | 8/2005 | Augusto | |
| 2006/0138471 | A1 | 6/2006 | Shim | |
| 2006/0160295 | A1 | 7/2006 | Kim | |
| 2007/0057147 | A1 | 3/2007 | Kim | |

FOREIGN PATENT DOCUMENTS

| | | |
|---|---|---|
| JP | 04-304655 | 10/1992 |
| JP | 10-144784 | 5/1998 |
| JP | 11-233610 | 8/1999 |

(Continued)

*Primary Examiner* — Thanhha Pham

(74) *Attorney, Agent, or Firm* — McAndrews, Held & Malloy, Ltd.

(57) ABSTRACT

An image sensor includes a trench formed by a shallow trench isolation (STI) process, a channel stop layer formed over a substrate in the trench, an isolation structure filled in the trench, and a photodiode formed in the substrate adjacent to a sidewall of the trench. In more detail of the image sensor, a trench is formed in a substrate through a STI process, and a channel stop layer is formed over the substrate in the trench. An isolation structure is formed in the trench, and a photodiode is fanned in the substrate adjacent to a sidewall of the trench.

17 Claims, 4 Drawing Sheets

308
307
306
TREN
309
302
301
303

FOREIGN PATENT DOCUMENTS

| | | |
|---|---|---|
| JP | 2001-015591 | 1/2001 |
| JP | 2004-088015 | 3/2004 |
| JP | 2005-197682 | 7/2005 |
| JP | 2006-287117 | 10/2006 |
| KR | 20020096136 | 12/2002 |
| KR | 20040003981 | 1/2004 |

* cited by examiner

IMAGE SENSOR AND METHOD FOR FABRICATING THE SAME

RELATED APPLICATIONS

This application is a continuation of U.S. patent application Ser. No. 12/632,424, entitled "Image Sensor and Method for Fabricating the Same," filed Dec. 7, 2009, now U.S. Pat. No. 7,893,469, which is a division of U.S. patent application Ser. No. 11/508,956, entitled "Image Sensor and Method for Fabricating the Same," filed Aug. 24, 2006, now U.S. Pat. No. 7,638,347, which in turn claims priority to Korean application KR 2005-0078838, filed Aug. 26, 2005, all of which are hereby incorporated by reference in their entireties.

FIELD OF THE INVENTION

The present invention relates to a method for fabricating a semiconductor device, and more particularly, to a method for fabricating an image sensor.

DESCRIPTION OF RELATED ARTS

Generally, image sensors have been used in a vast range of areas including domestic products such as digital cameras and cellular phones, endoscopes at hospitals, and telescopes of satellites.

FIG. 1 illustrates a cross-sectional view of a typical image sensor. A substrate 103 includes a lowly doped P-type epitaxial layer 102 formed on a highly doped $P^+$-type substrate 101. One reason for using the lowly doped P-type epitaxial layer 102 is because the existence of the lowly doped P-type epitaxial layer 102 allows a larger and deeper depletion region of a photodiode. Thus, the ability of the photodiode in concentrating photocharges can be increased. Another reason is because forming the highly doped $P^+$-type substrate 101 below the P-type epitaxial layer 102 allows a fast recombination of photocharges before the photocharges diffuse into adjacent unit pixels. Thus, random diffusion of the photocharges can be reduced, resulting in a reduced fluctuation of the photocharge transfer function. Subsequently, trenches are formed in the substrate 103 as a part of a process for forming an isolation structure using a shallow trench isolation (STI) process.

When the substrate 103 is etched to form the trenches, a great deal of micro defects result on inner walls of the trenches due to damages occurred during the etching. Hence, thermal oxide layers 104 are formed on the trenches by performing a rounding oxidation process. Then, high density plasma (HDP) oxide layers 106 are filled into the trenches.

Inner surfaces of the trenches are cured by forming the thermal oxide layers 104 inside the trenches. However, trap sites caused by the defects still exist on an interfacial surface between the thermal oxide layers 104 and the substrate 103 even after the rounding oxidation process is performed. If a photodiode 107 is formed in the substrate structure including the trap sites to generate photoelectrons by light, some of the photoelectrons may be trapped in the trap sites and cause a loss of light.

To overcome the above limitation, boron is implanted into the sidewall and bottom surfaces of the trenches to form N-channel stop (NCST) impurity regions 105. Sidewalls of the photodiode 107 are separated from the trenches by the NCST impurity regions 105, and thus, the photoelectrons can be prevented from being trapped in the trap sites and the loss of light can be reduced.

However, a horizontal portion of the NCST impurity regions 105 has a thickness ranging from 0.1 μm to 0.2 μm. Thus, a light characteristic may be deteriorated due to a reduced area of the photodiode 107

SUMMARY OF THE INVENTION

It is, therefore, an object of the present invention to provide a method for fabricating an image sensor, which can reduce loss of photoelectrons due to trap sites and increase a fill factor of a photodiode.

In accordance with an aspect of the present invention, there is provided an image sensor, including: a trench formed by a shallow trench isolation (STI) process; a channel stop layer formed over a substrate in the trench; an isolation structure filled in the trench; and a photodiode formed in the substrate adjacent to a sidewall of the trench.

In accordance with another aspect of the present invention, there is provided a method for fabricating an image sensor, including: forming a trench in a substrate through a STI process; forming a channel stop layer over the substrate in the trench; forming an isolation structure in the trench; and forming a photodiode in the substrate adjacent to a sidewall of the trench.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

An image sensor and a method for fabricating the same in accordance with exemplary embodiments of the present invention will be described in detail with reference to the accompanying drawings.

Figure 2:
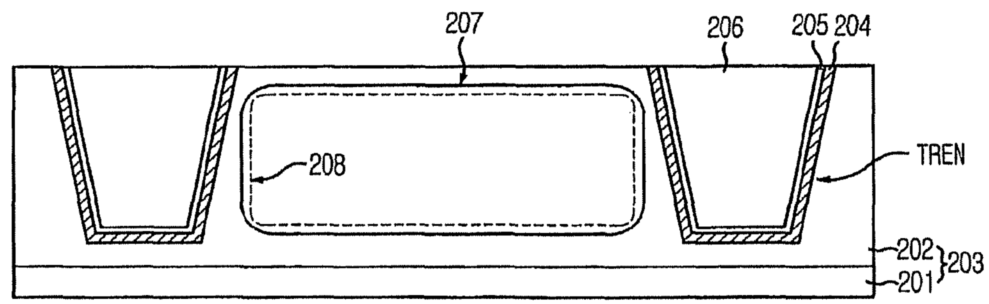
FIG. 2 illustrates a cross-sectional view of an image sensor in accordance with a specific embodiment of the present invention.

FIG. 2 illustrates a cross-sectional view of an image sensor in accordance with a specific embodiment of the present invention. A substrate 203 includes a lowly doped P-type epitaxial layer 202 formed on a highly doped $P^+$-type substrate 201. One reason for using the lowly doped P-type epitaxial layer 202 is because the existence of the lowly doped P-type epitaxial layer 202 allows a larger and deeper depletion region of a photodiode. Thus, the ability of the photodiode in concentrating photocharges can be increased. Another reason is because forming the highly doped $P^+$-type substrate 201 below the P-type epitaxial layer 202 allows a fast recombination of photocharges before the photocharges diffuse into adjacent unit pixels. Thus, random diffusion of the photocharges can be reduced, resulting in a reduced fluctuation of the photocharge transfer function. Trenches TREN are formed in the substrate 203 as a part of a process for forming an isolation structure using a shallow trench isolation (STI) process.

Channel stop layers 204 are formed in the trenches TREN. Thermal oxide layers 205 are formed over the channel stop layers 204, and an isolation material 206 is disposed over the thermal oxide layers 205 being filled into the trenches TREN.

The channel stop layers 204 include selective epitaxial growth (SEG) layers, formed by doping P-type impurities which have substantially the same conductivity type as the substrate 203. The P-type impurities may include boron. The boron-doped SEG layers are formed to overcome limitations associated with the typical trap sites.

The trap sites are generated due to changes in silicon lattice structures during the trench formation. By forming the SEG layers, the changes in the silicon lattice structures are reduced and the doped boron prevents a photodiode 207 including N-type impurities from overlapping with the trap sites.

The isolation material 206 includes a high density plasma (HDP) oxide-based material and filled into the trenches TREN. The thermal oxide layers 205 are formed by performing a rounding oxidation process. Reference numeral 208 represents a typical photodiode. A comparison between the photodiode 207 consistent with this embodiment and the typical photodiode 208 shows that a fill factor has increased in this embodiment.

Figure 1:
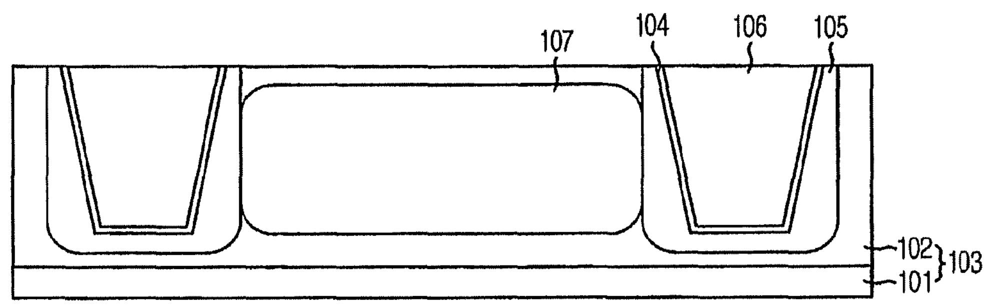
FIG. 1 illustrates a cross-sectional view of a typical image sensor.
Figure 3:
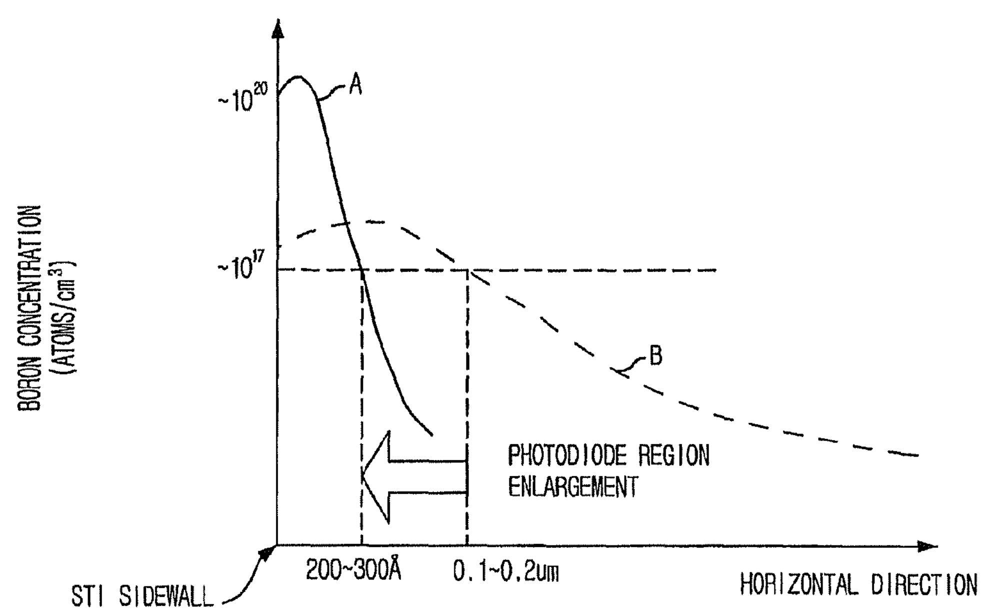
FIG. 3 illustrates a graph of horizontal thicknesses of a typical channel stop region and a channel stop region according to a specific embodiment of the present invention, each horizontal thickness changing with respect to boron concentration.

FIG. 3 illustrates a graph of horizontal thicknesses of a typical channel stop region and a channel stop region consistent with this embodiment, each horizontal thickness changing with respect to boron concentration. Reference letter 'A' represents the channel stop region consistent with this embodiment, i.e., the channel stop layers 204 in FIG. 2, and reference letter 'B' represents the typical channel stop region, i.e., the N-channel stop (NCST) impurity regions 105 in FIG. 1. The graph shows that the channel stop region 'A' has a higher impurity concentration level than the typical channel stop region 'B' and yet has a smaller horizontal thickness than the typical channel stop region 'B'. Consequently, the higher impurity concentration level allows easier separation of the channel stop region 'A' from a photodiode, and the small horizontal thickness results in an increased fill factor of the photodiode.

Figure 4A:
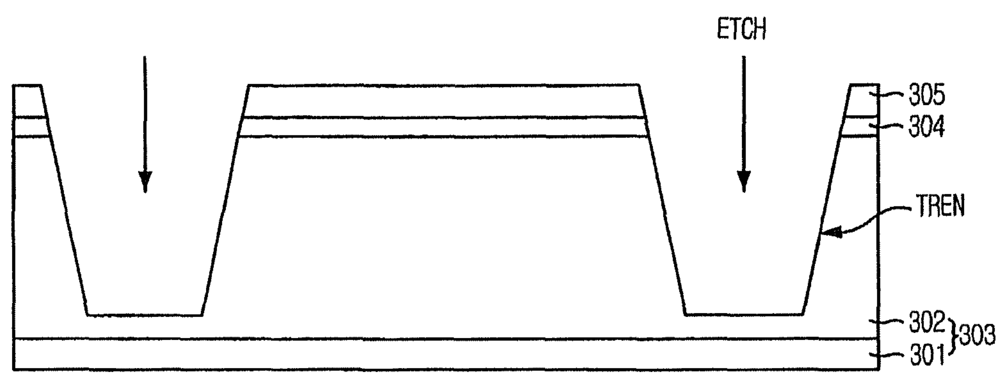
FIGS. 4A to 4C illustrate cross-sectional views of an image sensor structure to describe a method for fabricating the same in accordance with a specific embodiment of the present invention.
Figure 4B:
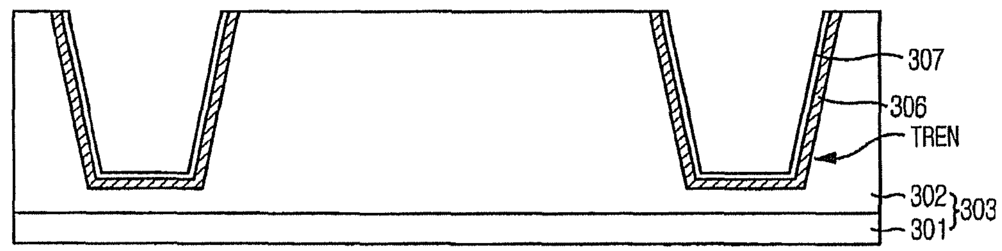
Figure 4C:
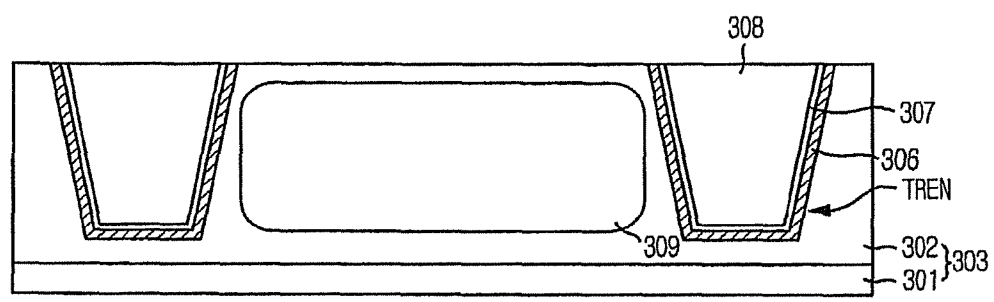

FIGS. 4A to 4C illustrate cross-sectional views of an image sensor structure to describe a method for fabricating the same.

Referring to FIG. 4A, a substrate 303 includes a lowly doped P-type epitaxial layer 302 formed on a highly doped $P^+$-type substrate 301. One reason for using the lowly doped P-type epitaxial layer 302 is because the existence of the lowly doped P-type epitaxial layer 302 allows a larger and deeper depletion region of a photodiode. Thus, the ability of the photodiode in concentrating photocharges can be increased. Another reason is because forming the highly doped $P^+$-type substrate 301 below the P-type epitaxial layer 302 allows a fast recombination of photocharges before the photocharges diffuse into adjacent unit pixels. Thus, random diffusion of the photocharges can be reduced, resulting in a reduced fluctuation of the photocharge transfer function.

Although not illustrated, a pad oxide layer and a pad nitride layer are sequentially formed over the substrate 303. Predetermined portions of the pad oxide layer and the pad nitride layer are etched away to form a patterned pad oxide layer 304 and a patterned pad nitride layer 305, exposing regions where an isolation structure is to be formed. The substrate 303 is etched to form trenches TREN using the patterned pad oxide layer 304 and the patterned pad nitride layer 305 as an etch barrier.

Referring to FIG. 4B, channel stop layers 306 are formed in the trenches TREN. The channel stop layers 306 include boron doped SEG layers which have substantially the same conductivity type as the substrate 303.

The SEG layers are formed at a temperature ranging from approximately 700° C. to approximately 1,000° C. using a gas selected from a group consisting of diborane ($B_2H_6$), silane ($SiH_4$), and hydrogen chloride (HCl). The SEG layers are doped with boron at approximately $1\times10^{20}$ atoms/cm$^3$.

The channel stop layers 306 are formed to overcome limitations associated with the typical trap sites. In general, trap sites are generated due to changes in silicon lattice structures during the trench formation. By forming the SEG layers, the changes in the silicon lattice structures are reduced and the doped boron prevents a photodiode including N-type impurities from overlapping with the trap sites.

A rounding oxidation process is performed to form thermal oxidation layers 307 over the channel stop layers 306, and the patterned pad oxide layer 304 and the patterned pad nitride layer 305 are removed. The thermal oxide layers 307 are oxidized at a temperature ranging from approximately 800° C. to approximately 900° C. using one of oxygen ($O_2$) gas and water ($H_2O$) gas.

Referring to FIG. 4C, an HDP oxide layer is filled into the trenches TREN to form an isolation structure 308. N-type impurities are implanted into the substrate 303 adjacent to sidewalls of the trenches TREN to form a photodiode 309. A fill factor of the photodiode 309 increases because channel stop regions, i.e. the channel stop layers 306, are formed inside the trenches TREN using the SEG layers.

Consistent with this embodiment, the limitations associated with loss of the photoelectrons due to the trap sites can be reduced by forming the channel stop regions using the SEG layers. The SEG layers are doped with impurities and formed in the trenches, wherein the trenches are used in the forming of the isolation structure. The impurities have substantially the same conductivity type as the substrate. Thus, a light sensing efficiency improves, and the fill factor of the photodiode increases because the channel stop regions are formed in the trenches.

The present application contains subject matter related to the Korean patent application No. KR 2005-0078838, filed in the Korean Patent Office on Aug. 26, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

The invention claimed is:

1. An image sensor, comprising:

a trench disposed in a substrate;

a channel stop layer disposed over an inner surface of the trench;

an isolation structure disposed within the trench; and a photodiode disposed in the substrate.

2. The image sensor of claim 1, further comprising a thermal oxide layer disposed between the channel stop layer and the isolation structure.

3. The image sensor of claim 1, wherein the channel stop layer comprises a selective epitaxial growth (SEG) layer.

4. The image sensor of claim 3, wherein the SEG layer is doped with impurities of a conductive type having substantially the same conductive type as the substrate, and wherein the impurities comprise boron (B).

5. The image sensor of claim 1, wherein the isolation structure comprises a high density plasma (HDP) oxide layer.

6. The image sensor of claim 1, wherein the photodiode is located adjacent to a sidewall of the trench.

7. An image sensor, comprising:

a trench disposed in a substrate;

a channel stop layer disposed within the trench;

an isolation structure disposed within the trench; and a photodiode disposed in the substrate.

8. The image sensor of claim 7, further comprising a thermal oxide layer disposed between the channel stop layer and the isolation structure.

9. The image sensor of claim 7, wherein the channel stop layer comprises a selective epitaxial growth (SEG) layer.

10. The image sensor of claim 9, wherein the SEG layer is doped with impurities of a conductive type having substantially the same conductive type as the substrate, and wherein the impurities comprise boron (B).

11. The image sensor of claim 7, wherein the isolation structure comprises a high density plasma (HDP) oxide layer.

12. The image sensor of claim 7, wherein the photodiode is located adjacent to a sidewall of the trench.

13. An image sensor, comprising:

a trench disposed in a substrate;

a channel stop layer disposed within the trench; and a thermal oxide layer disposed between the channel stop layer and an isolation structure.

14. The image sensor of claim 13, wherein the channel stop layer comprises a selective epitaxial growth (SEG) layer.

15. The image sensor of claim 13, wherein the SEG layer is doped with impurities of a conductive type having substantially the same conductive type as the substrate, and wherein the impurities comprise boron (B).

16. The image sensor of claim 13, wherein the isolation structure comprises a high density plasma (HDP) oxide layer.

17. The image sensor of claim 13, further comprising a photodiode located adjacent to a sidewall of the trench.

* * * * *

UNITED STATES PATENT AND TRADEMARK OFFICE

CERTIFICATE OF CORRECTION

PATENT NO. : 8,476,685 B2
APPLICATION NO. : 13/023754
DATED : July 2, 2013
INVENTOR(S) : Lee It is certified that error appears in the above-identified patent and that said Letters Patent is hereby corrected as shown below:

On the Title Page, Item (75), under "Inventor", in Column 1, Line 1, delete "Chungeheongbuk-do" and insert -- Chungcheongbuk-do --, therefor.

On the Title Page, in Column 1, delete Item "(60)" and insert Item -- (63) --, therefor.

On the Title Page, Item (57), under "ABSTRACT", in Column 2, Line 9, delete "fanned in the substrate" and insert -- formed in the substrate --, therefor.

In the Specification

In Column 2, Line 4, delete "107" and insert -- 107. --, therefor.

Signed and Sealed this
Eleventh Day of March, 2014

Michelle K. Lee
*Deputy Director of the United States Patent and Trademark Office*